United States Patent [19]
Clinton et al.

[11] Patent Number: 5,631,578
[45] Date of Patent: May 20, 1997

[54] PROGRAMMABLE ARRAY INTERCONNECT NETWORK

[75] Inventors: Kim P. N. Clinton, Essex Junction; Scott W. Gould, South Burlington; Steven P. Hartman, Jericho; Joseph A. Iadanza, Hinesburg; Frank R. Keyser, III, Colchester; Eric E. Millham, St. George, all of Vt.

[73] Assignee: International Business Machines Corporation, Armonk, N.Y.

[21] Appl. No.: 459,579

[22] Filed: Jun. 2, 1995

[51] Int. Cl.$^6$ ............................................. H03K 19/177
[52] U.S. Cl. ..................................... 326/41; 326/39
[58] Field of Search ........................... 326/39, 40, 41

[56] References Cited

U.S. PATENT DOCUMENTS

| | | | |
|---|---|---|---|
| Re. 34,363 | 8/1993 | Freeman | 326/38 |
| 4,609,986 | 9/1986 | Hartmann et al. | 364/200 |
| 4,617,479 | 10/1986 | Hartmann et al. | 326/45 |
| 4,642,487 | 2/1987 | Carter | 326/41 |
| 4,758,745 | 7/1988 | Elgamal et al. | 326/41 |
| 4,774,421 | 9/1988 | Hartmann et al. | 326/44 |
| 5,055,718 | 10/1991 | Galbraith et al. | 326/46 |
| 5,073,729 | 12/1991 | Greene et al. | 326/47 |
| 5,144,166 | 9/1992 | Camarota et al. | 326/41 |
| 5,187,393 | 2/1993 | El Gamal et al. | 326/41 |
| 5,208,491 | 5/1993 | Ebeling et al. | 326/41 |
| 5,212,652 | 5/1993 | Agrawal et al. | 364/489 |
| 5,218,240 | 6/1993 | Camarota et al. | 326/39 |
| 5,231,588 | 7/1993 | Agrawal et al. | 364/489 |
| 5,233,539 | 8/1993 | Agrawal et al. | 364/489 |
| 5,245,227 | 9/1993 | Furtek et al. | 326/38 |
| 5,255,203 | 10/1993 | Agrawal et al. | 364/489 |
| 5,260,611 | 11/1993 | Cliff et al. | 326/41 |
| 5,260,881 | 11/1993 | Agrawal et al. | 364/489 |
| 5,298,805 | 3/1994 | Garverick et al. | 326/37 |
| 5,317,209 | 5/1994 | Garverick et al. | 326/39 |
| 5,319,254 | 6/1994 | Goetting | 326/21 |
| 5,323,069 | 6/1994 | Smith, Jr. | 326/47 |
| 5,329,460 | 7/1994 | Agrawal et al. | 364/489 |
| 5,338,984 | 8/1994 | Sutherland | 326/47 |
| 5,455,525 | 10/1995 | Ho et al. | 326/41 |
| 5,469,003 | 11/1995 | Kean | 326/39 |

FOREIGN PATENT DOCUMENTS

| | | | |
|---|---|---|---|
| 463746A2 | 5/1991 | European Pat. Off. | G06F 15/60 |
| 461798A2 | 6/1991 | European Pat. Off. | |
| 630115A2 | 6/1994 | European Pat. Off. | H03K 19/177 |

OTHER PUBLICATIONS

F. Furtek, "An FPGA Architecture for Data-Path Applications", IEEE Computer Society Press, Feb. 1993, pp. 374–377.

M. Khellah, et al., "Minimizing Interconnection Delays in Array-based FPGAs", IEEE, 1994, Custom INtegrated Circuits Conference, pp. 181–184.

T. Kean, PCT Patent Application WO 94/10754, "Improved Configurable Cellular Array", May 11, 1994.

Atmel, "Field Programmable Gate Arrays AT6000 Series", 1993, pp. 1–16.

Motorola, "Product Brief, MPA10xx Field Programmable Gate Arrays," dated Sep. 27, 1993.

Payton, M., "The Motorola PFGA," Briefing, 22 pgs., dated Sep. 14, 1993.

*Primary Examiner*—Edward P. Westin
*Assistant Examiner*—Benjamin D. Driscoll
*Attorney, Agent, or Firm*—Heslin & Rothenberg, P.C.; Susan M. Murray, Esq.

[57] ABSTRACT

A programmable interconnection system for a programmable array includes pluralities of parallel buses for rows and columns of logic cells arranged in the array. Two groups of seven buses are provided for each row or column of logic cells. The buses include conductors connectable to each other, and selectively connectable to, or isolated from, the logic cells. A hierarchy of conductor lengths is disclosed to provide intra-sector and inter-sector bussing. Staggered switching is employed for adjacent sector access.

29 Claims, 6 Drawing Sheets fig. 1 fig. 2 fig. 3 fig. 4 fig. 5 fig. 6 fig. 7

5,631,578

PROGRAMMABLE ARRAY INTERCONNECT NETWORK

RELATED APPLICATION INFORMATION

This application relates to commonly owned concurrently filed U.S. Patent applications:

1. Ser. No. 08/460,481, Docket No. BU9-95-019, entitled "PROGRAMMABLE LOGIC CELL;"
2. Ser. No. 08/459,156, Docket No. BU9-95-024, entitled "PROGRAMMABLE ARRAY CLOCK/RESET RESOURCE;" and
3. Ser. No. 08/460,420, Docket No. BU9-95-023, entitled "PROGRAMMABLE ARRAY I/O ROUTING RESOURCE."

The section entitled "Description of the Preferred Embodiment(s)," and the drawings, from each of the above-referenced related U.S. patent applications are hereby expressly incorporated herein by reference.

TECHNICAL FIELD

This invention relates in general to integrated circuit devices, and, more specifically, to programmable integrated circuit devices having a plurality of programmable logic cells and a programmable interconnect network.

BACKGROUND OF THE INVENTION

Programmable integrated circuits are known in the art and include programmable logic devices ("PLDs"), Programmable Array Logic ("PALs"), and Programmable Logic Arrays ("PLAs"). Each of these programmable circuits provides an input AND logic plane followed by an OR logic plane. An output function can thus be calculated which is the sum of the products of the input terms. The logic planes are usually programmable such that the initial general layout of the planes may be customized for a particular application.

A more general approach to programmable circuits involves providing an array of distinct, uncommitted logic cells in a Programmable Gate Array ("PGA"). A programmable interconnect network is provided to interconnect the cells, and to provide data input to, and output from, the array. Customization or programming of the otherwise generally-designed logic cells and interconnect network is performed for a particular application. One such array is a Mask Programmable Gate Array ("MPGA"), wherein the configuration of the cells and the wiring network occurs when adding the final layers of metallization to an integrated circuit. A modified approach involves the use of laser-directed energy to customize the metallization pattern. Another such array is a Field Programmable Gate Array ("FPGA"), wherein the configuration can be performed by a user, in the "field." Such configuration may be effected by using electrically programmable fusible links, antifuses, memory-controlled transistors, floating-gate transistors, or the like.

Regardless of the type of programing employed, the capabilities and efficiency of the array are determined primarily by the types and amounts of uncommitted resources provided in the logic cells and the interconnect network. One prior art approach to programmable interconnect networks employs a large group of lines (i.e., 25), including a mix of general interconnect lines and long lines, for each row or column of logic cells (see, e.g., U.S. Pat. No. 5,260,881 assigned to Advanced Micro Devices, Inc.). Numerous programmable switches and programmable interconnection points are placed within these groups of lines to segment the lines and to provide signals between the segmented lines. FIGS. 4 and 5 therein depict the distribution and types of lines, and FIGS. 1, 6 and 17–19 depict the placement and structure of the switches and interconnect points.

Another prior art approach employs a smaller number (i.e., 4) of buses for each row or column of logic cells (see, e.g., U.S. Pat. No. 5,298,805 assigned to National Semiconductor Corporation). As shown in FIGS. 9 and 23B therein, a regular pattern of switches (i.e., switching repeaters) is employed for providing signals between collinear conductors of each bus and between conductors of adjacent buses. The networks disclosed in U.S. Patents Nos. 4,642,487 and 4,870,302 assigned to Xilinx, Inc., also disclose buses and regular switch patterns therein. Improved bus segmenting patterns are disclosed in U.S. Pat. Nos. 5,187,393 and 5,073,729 assigned to Actel Corporation.

Manufacturers of programmable gate arrays face a tradeoff between the amount of uncommitted network resources supplied (which is directly proportional to the design flexibility of the array afforded a user), and the efficiency of the array, i.e., the amount of network resources actually employed in a user design. To supply the user with the maximum amount of design flexibility, a large amount of uncommitted resources in a highly generalized, regular arrangement is desirable. However, many of these resources remain unused following programming, thus wasting chip space and possibly power. Conversely, to achieve high efficiency, a reduced amount of uncommitted resources is desirable. However, this approach would adversely impact the design flexibility of the array.

Thus, improvements to the prior art approaches to interconnect networks are required which minimize the amount of unused resources following array programming. These improvements should simultaneously afford the array user or programmer a suitable level of design flexibility. These improvements should thus result in a manageable amount of programmable resources (thereby increasing efficiency) being arranged in a way which provides a satisfactory level of design flexibility to an array user.

SUMMARY OF THE INVENTION

Briefly summarized, the present invention, in one aspect, is a programmable array having a plurality of logic cells arranged therein. The programmable array also includes a programmable interconnect network including a first plurality of interconnect buses, the first plurality of interconnect buses being associated with, and running along, a row or column of logic cells of the plurality of logic cells. The first plurality of interconnect buses includes first and second pluralities of local buses having conductors, wherein the conductors of the local buses are selectively connectable to the logic cells of the row/column for logic signal input and output. The first plurality of interconnect buses also includes first and second pluralities of express buses having conductors, wherein the conductors of the express buses are generally electrically isolated from the logic cells of the row/column and have lengths of less than the entire length of the row/column.

First and second long interconnect buses are also provided which are generally electrically isolated from the logic cells of the row/column of logic cells. The first and second long interconnect buses each include a conductor running essentially the entire length of the row/column.

The first plurality of interconnect buses includes a first plurality of programmable elements for providing signals between selected pairs of the conductors of the first plurality of local buses, the first plurality of express buses, and the first long bus. A second plurality of programmable elements is also employed for providing signals between selected pairs of the conductors of the second plurality of local buses, the second plurality of express buses and the second long bus.

The first and second pluralities of programmable elements divide the buses into conductor lengths. The pluralities of programmable elements each include a plurality of programmable switches (possibly switching repeaters) positioned at equivalent first intervals, and a plurality of programmable jumpers connected within buses of the first and second pluralities of local buses for selectively connecting conductors thereof. The interior conductors of the local buses have lengths between programmable elements equal to the first interval and less than the first interval; and the interior conductors of the express buses have lengths between programmable elements equal to the first interval and greater than the first interval.

The programmable array may also include a second plurality of interconnect buses being associated with a column/row of logic cells and intersecting the first plurality of interconnect buses. The second plurality of interconnect buses includes first and second pluralities of local buses, first and second pluralities of express buses, first and second long interconnect buses, and first and second pluralities of programmable elements, all being arranged similarly to those in the first plurality of interconnect buses. The interconnect network may also include a plurality of programmable bus turns for programmably connecting corresponding intersecting buses of the local buses and express buses of the first and second pluralities of interconnect buses.

In one embodiment, each of the first and second pluralities of local buses of the first and second pluralities of interconnect buses includes four local buses. The first and second pluralities of express buses of each of the first and second pluralities of interconnect buses each includes two express buses.

The first and second pluralities of interconnect buses may intersect proximate a given logic cell common to said row/column and said column/row of said logic cells. Substantially all of the local buses of the first and second pluralities of interconnect buses are programmably connectable to the logic cell for providing input signals thereto and receiving output signals therefrom.

In another aspect of the invention, a programmable array is provided having a plurality of logic cells and further including a programmable interconnect network including a first plurality of interconnect buses associated with a row or column of logic cells. The first plurality of interconnect buses includes first and second groups of buses, each of the first and second groups of buses including a first, second and third bus. The plurality of interconnect buses further includes a plurality of programmable interior switches connected at regular intervals within each of the first and second groups of buses. Each switch provides signals between conductors of two buses within each of the first and second groups of buses, wherein the second buses are isolated from odd/even ones of the switches within the first group of buses and from even/odd ones of the switches within the second group of buses. The third buses are isolated from the even/odd ones of the switches within the first group of buses and from odd/even ones of the switches within the second group of buses.

In one embodiment the first buses are local buses programmably connectable to logic cells of the row or column of logic cells, the second buses are express buses isolated from the logic cells, and the third buses are super buses having a conductor being isolated from the logic cells and running essentially the entire length of the row or column.

By providing the unique arrangement of interconnect buses, including local, express and long or super buses, and an innovative arrangement of programmable switches and jumpers therein, the array the amount of unused resources following array and interconnect system of the present invention simultaneously afford an array user or programmer a suitable level of design flexibility while minimizing programming.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following detailed description of a preferred embodiment and the accompanying drawings in which:

DESCRIPTION OF THE PREFERRED EMBODIMENT(S)

Figure 1:
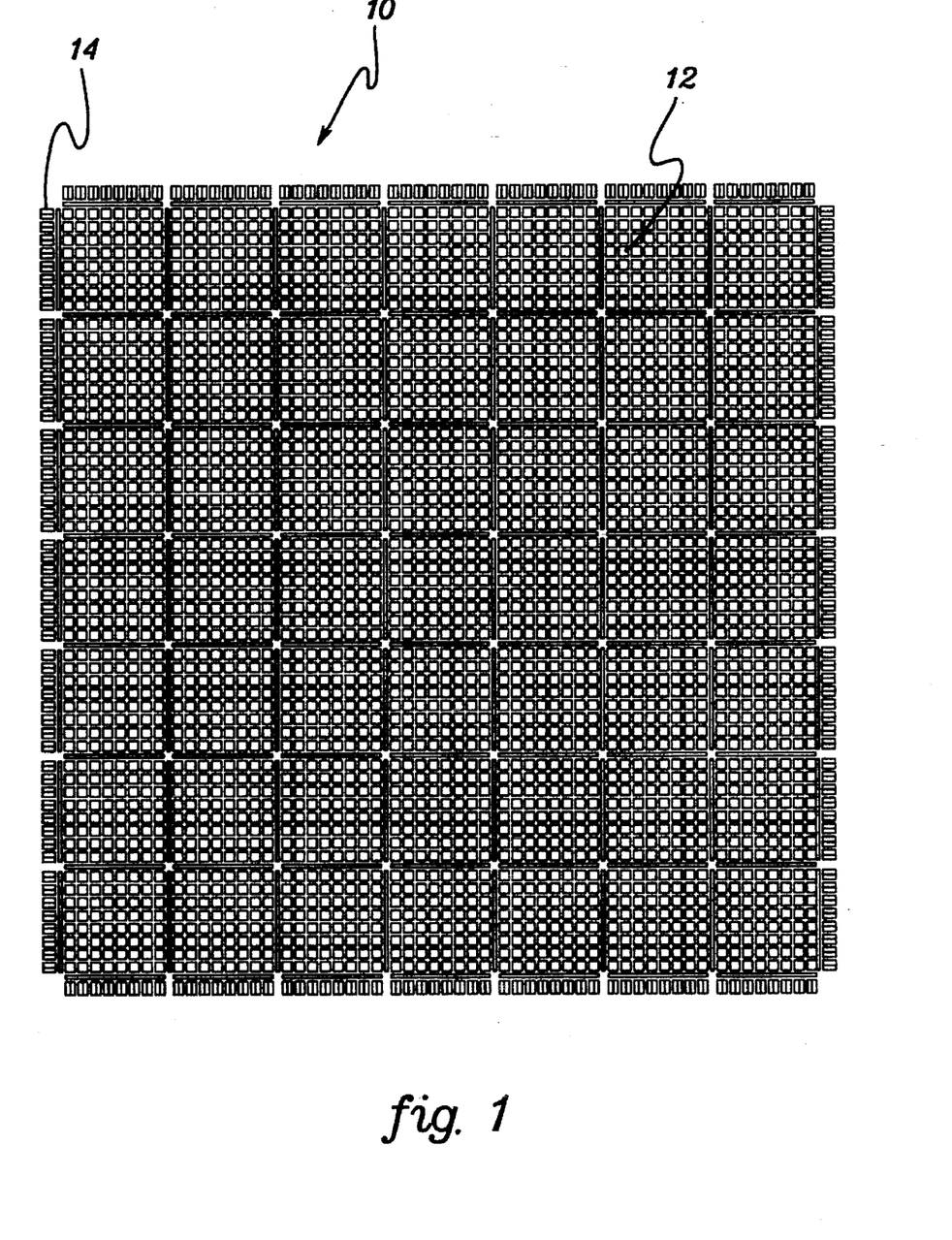
FIG. 1 depicts a programmable array having a plurality of logic cells arranged therein, the plurality of logic cells being separated into sectors and interconnected by a programmable interconnect network pursuant to the principles of the present invention.

With reference to FIG. 1, there is shown a layout of an integrated circuit programmable gate array 10 comprising a plurality of programmable logic cells 12. In this particular embodiment, the plurality of programmable logic cells comprises a 56×56 array of cells divided into sectors of cells, wherein each sector is defined by an 8×8 group of cells. The programmable logic cells of the array can be implemented according to the above-incorporated portions of the U.S. patent application entitled "PROGRAMMABLE LOGIC CELL," or can be any type of known logic cells, including AND/OR macrocells as in PALs or PLAs. Also depicted are the input/output ("I/O") blocks 14 along the perimeter of the array which are used for data input and output. The I/O portions of the array can be implemented according to the above-incorporated portions of the U.S. patent application entitled "PROGRAMMABLE ARRAY I/O ROUTING RESOURCE."

Figure 2:
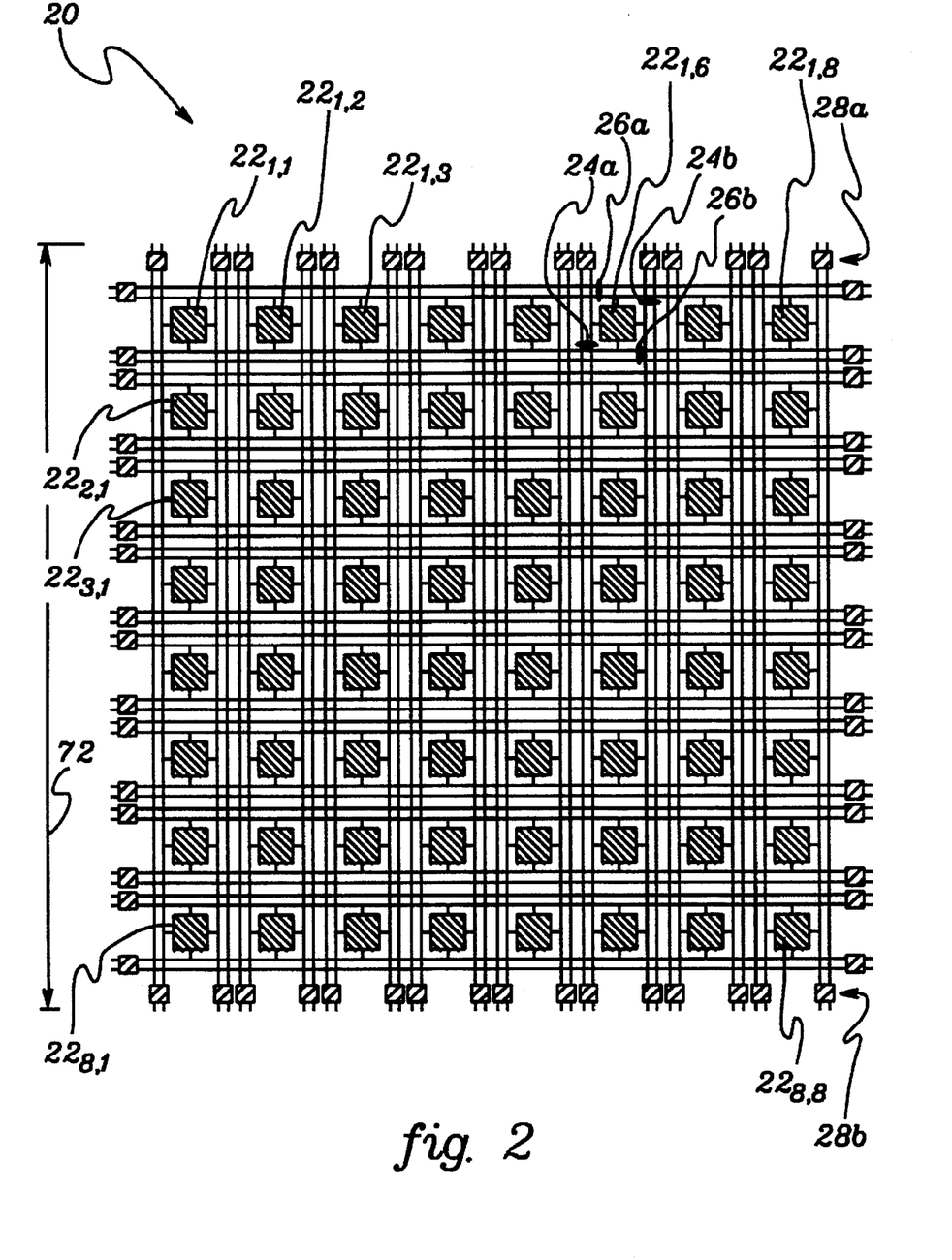
FIG. 2 depicts a single sector of logic cells of the array of FIG. 1.

With reference to FIG. 2, there is shown a single sector 20 of programmable logic cells of the array of FIG. 1. A single sector comprises logic cells $22_{1,1}$ to $22_{8,8}$ arranged in rows and columns of contiguous, but not necessarily abutting, logic cells. With reference to logic cell $22_{1,6}$, the cell is shown generally surrounded by exemplary vertical interconnect buses 24a and 24b, and horizontal interconnect buses 26a and 26b. These horizontal and vertical interconnect buses are positioned between each row and column of the array and provide connections between any two logic cells in the array, or between any logic cell in the array and the I/O blocks. As used herein, a bus represents a single conductor or a group of conductors, generally co-linearly arranged, which may be interrupted by programmable interconnect elements, switches or repeaters. The terms "adjacent" or "co-linear," when used herein when referring to conductors, denote conductors which, when connected together, form a functional, elongated bus. The individual conductors may or may not be precisely, physically co-linear in an actual implementation. The interconnect buses together form the overall programmable interconnect network of the programmable array. The placement of switches 28a and 28b define the boundaries of each sector. Length 72 (in this example, 8 logic cells) therefore represents the length or width of a square sector. As used herein, the term "length" denotes either the functional or physical length of a structure (e.g., a conductor) in logic cell units. Thus, a conductor having a specified length in the array denotes that an unobstructed electrical path is available between the cells at either end of the conductor. The term "interval" is similarly employed herein. The term "divisible," when used herein, denotes a division with or without a remainder.

Figure 3:
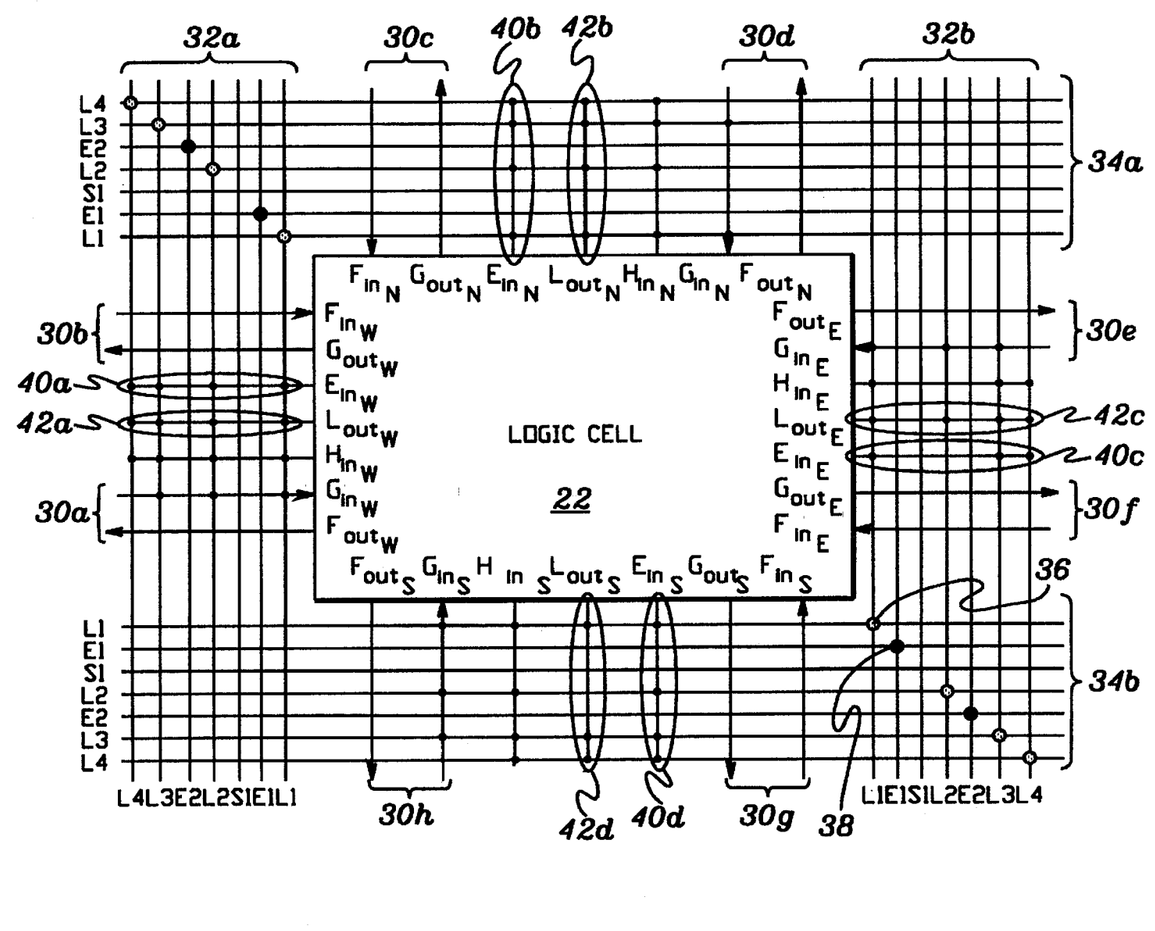
FIG. 3 depicts the groups of buses associated with a row of logic cells and the groups of buses associated with a column of logic cells intersecting at one logic cell.

FIG. 3 depicts a selected logic cell 22 from the array of FIG. 1. The logic cell is simultaneously a member of a row of logic cells and a column of logic cells. The designation "row/column," when used alone herein, denotes either a row or a column. The designations "row/column" and "column/row," when used together herein, denote either (1) a row and a column, or (2) a column and a row. This convention is similarly used for other terms. Thus, the logic cell 22 is at the intersection of a row/column and a column/row of logic cells.

Figure 4:
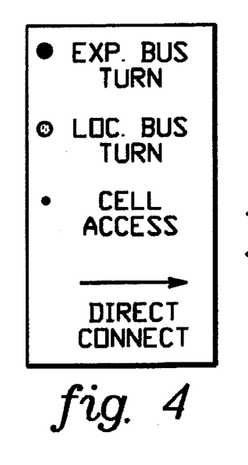
FIG. 4 is a key to FIG. 3.

Pursuant to the principles of the present invention, associated with each row of logic cells are two groups of buses, 34a and 34b. Associated with each column of logic cells are also two groups of buses 32a and 32b. At each logic cell, the buses associated with the row and column intersect and the programmable connections possible between the intersecting buses near the logic cells, and between the buses and the logic cell, are also depicted in FIG. 3 in the upper right and lower left regions of the diagram. These intersection connections are referred to herein as bus turns, and their symbols are depicted in FIG. 4.

Pursuant to the principles of the present invention, each group of buses (32a, 32b, 34a or 34b) includes four local buses ("L"), two express buses ("E"), and one super bus ("S"). Thus, two groups of at least seven buses are employed for each row or column of logic cells in the array. The structure depicted in FIG. 3 can be generally replicated for each of the logic cells in the array. The terms "local," "express," and "super" should not be construed as being limited to the particular bus embodiments described herein.

Logic cell 22 can be formed in accordance with the above-incorporated portions of the U.S. Patent application entitled "PROGRAMMABLE LOGIC CELL." Briefly summarized, the logic cell includes four input nodes designated $E_{in}$, $F_{in}$, $G_{in}$ and $H_{in}$, and two output nodes, designated $F_{out}$ and $G_{out}$. In addition to the F and G output nodes, an L output node is also provided for providing signals from either the F or G output nodes to the local buses L of the interconnect network. The local buses are selectively connectable to the input nodes of logic cell 22. These connections include inputs from any of the buses in any of the four groups 32a, 32b, 34a and 34b. For example, local buses from each of these groups are shown connectable to the $E_{in}$ node in regions 40a–d. The $E_{in}$ node actually includes a programmable multiplexer selecting from the 15 potential local bus input signals depicted in regions 40. A similar level of connectivity can be provided to the F, G and H input nodes, and exemplary connections are depicted in FIG. 3. In addition to the level of input access, a level of output access is similarly improved over the prior art techniques. This level of output access includes output connections from the $L_{out}$ node depicted in regions 42a–d. The $L_{out}$ node similarly comprises a multiplexer capable of applying a signal to any of the local buses of groups 32a–b and 34a–b. Also depicted are direct connections 30a–h. These conductors comprise direct connections from adjacent logic cells to the F and G input nodes, and from the F and G output nodes to adjacent logic cells.

The E and S buses are not connectable to, i.e., are electrically isolated from, logic cells because their use is reserved for signals requiring longer or faster signal paths within the interconnect network. Access to the E and S buses is described below with references to FIGS. 5 and 6.

Also depicted in FIG. 3 are programmable interconnections between vertical group 32a and horizontal group 34a, and between vertical group 32b and horizontal group 34b. For example, a programmable element or bus turn 36 is available between the corresponding intersecting L1 conductors of groups 32b and 34b. A similar programmable element is provided for each of the corresponding intersecting local buses. Similarly, a programmable element or bus turn 38 is provided for the intersecting E1 buses of groups 32b and 34b. A similar programmable element is also available for the intersecting E2 buses. FIG. 4 is a key to the symbols used in FIG. 3. In a preferred embodiment, the bus turns are transmission gates controlled by SRAM cells.

Figure 5:
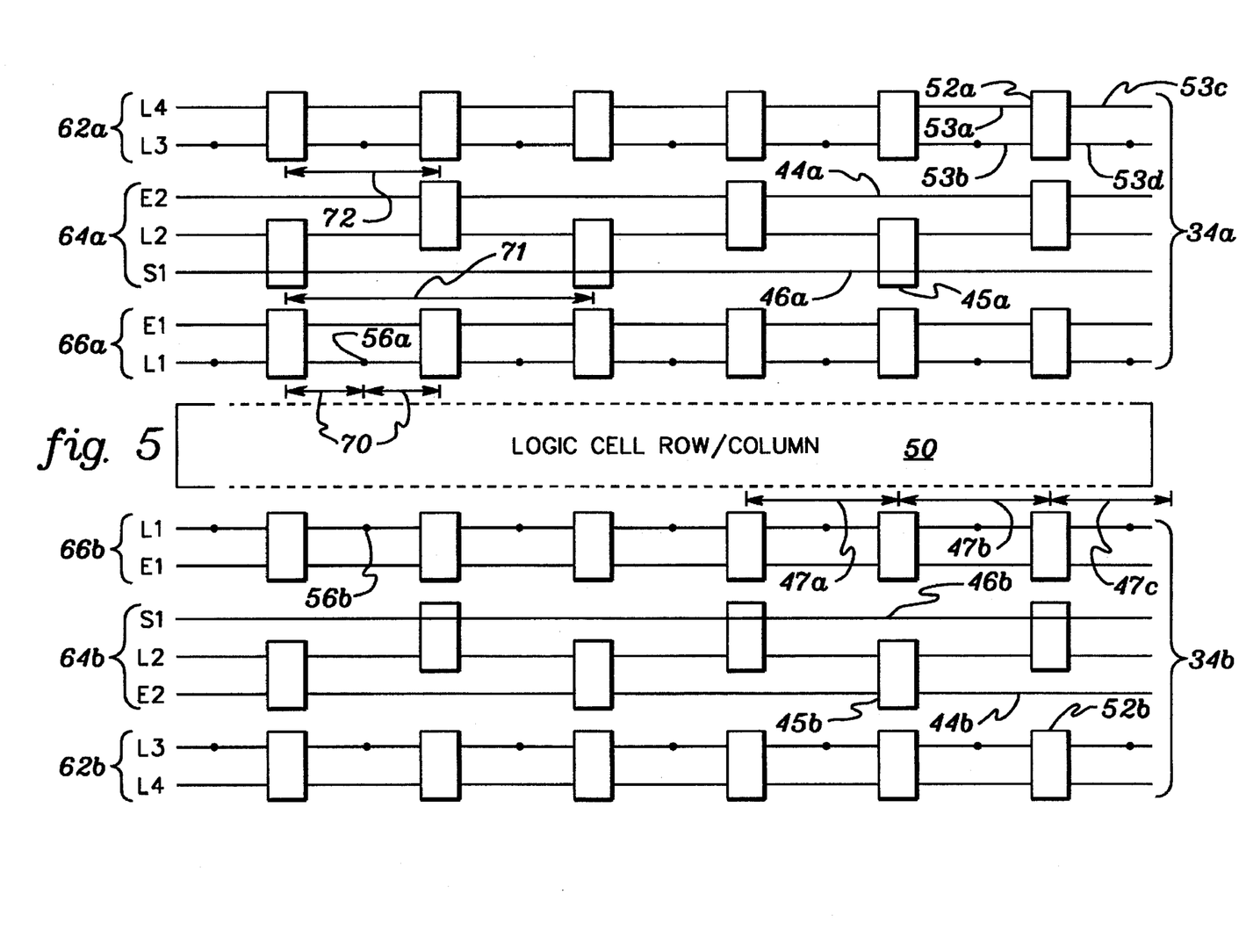
FIG. 5 depicts the arrangement of conductors, programmable switches, and programmable jumpers in the buses associated with a row or column of logic cells pursuant to the principles of the present invention.

Having described the general makeup of the buses and their selective isolation to logic cells, reference is made to FIG. 5 which depicts the arrangement of the buses of the interconnect network for an entire row or column of logic cells 50. Again, a logic cell row or column has associated therewith groups of buses 34a and 34b. These groups are similarly formed. Each of the groups 34 is further partitioned into groups 62, 64 and 66, wherein a partition is generally characterized by signal availability between all of the buses therein. Signals are made available between buses by, for example, switches 52. The preferred embodiment of a switch is discussed in greater detail below with respect to FIG. 7, however, a switch is broadly defined herein as any programmable means by which signals from any connected conductor can be provided to any of the other connected conductors. For example, switch 52a can provide signals between any one of the conductors 53a–d to another of the conductors 53a–d. The switches are depicted as boxes in FIG. 5. For clarity, only some of the switches in FIG. 5 are given reference numerals.

FIG. 5 shows all of the switches (e.g. 52) placed at regular intervals 72 within the logic cell row/column. These intervals can correspond to the length of one sector as discussed above regarding FIG. 2. Thus, the programmable array can be generally described as being broken into sectors, wherein programmable switches are placed in the interconnect network at the sector boundaries.

Also depicted in FIG. 5 are programmable elements or jumpers 56 which allow selective connections between adjacent conductors in a bus. For example, programmable elements 56a and 56b are provided between conductors of the L1 buses of groups 66a and 66b, respectively. The placement of these programmable elements in the local buses divides the local buses into lengths shorter than one sector. In the preferred embodiment, these programmable elements are placed at half sectors thus resulting in a length 70 being equal to one-half of a sector 72, and include transmission gates controlled by SRAM cells.

As discussed above, the local buses L are selectively connectable to the logic cells, and the express and super buses are generally electrically isolated from the logic cells. This selective isolation, and selective placement of the switches (e.g. 52) and programmable elements of FIG. 5, results in an establishment of a bus hierarchy. This hierarchy results in the conductors within local buses L being of a length equal to or less than the length of a sector, and the conductors of the express buses E being of a length equal to or greater than the length of a sector. Thus, local buses will generally be used for intra-sector transfer of signals, and express buses will generally be used for inter-sector transfer of signals. In addition to this hierarchy of local and express buses, the super bus S is provided which generally spans the length of the entire row/column of logic cells. The switches shown connected to the super buses in FIG. 5 do not divide the super bus, but rather, are for providing signals between the conductor of the super bus and conductors of the L2 bus in groups 64a and 64b. Those skilled in the art will recognize that the super bus could be interrupted at selected ones of the switches in alternate embodiments and that the super bus may be a bus that is merely longer than any of the local and express buses associated therewith.

Another feature of the present invention is depicted in FIG. 5. With specific reference to bus groups 64a and 64b, a staggered pattern of switches is provided therein. Thus, unlike groups 62 and 66 which are generally symmetrical, groups 64 are not symmetrical in that the pattern of switches is staggered such that overlapping longer lengths of the E2 buses are provided which span two sectors (e.g., length 71). For example, switch 45a in group 64a provides signals between the S1 bus 46a and the L2 bus. This switch is isolated from conductor 44a of the E2 which thus spans the length of two sectors. However, in group 64b, switch 45b, which is located in a position in the row or column corresponding to switch 45a, is connected between L2 and E2 buses. Thus, in this group, the E2 bus is interrupted at this corresponding position, and the switch 45b is electrically isolated from portion 46b of the super bus. An inter-sector E2 bus is thus available to the sector 47b for communication with the left sector 47a (via bus 44a) or the right sector 47c (via bus 44b). This staggered pattern is enforced for the interior conductors of the buses but may be modified near the ends of the buses, e.g., if an odd number of sectors is provided. Interior conductors are thus those conductors of a bus which do not extend to either edge of the bus. The staggering pattern may result, in one embodiment, in intersecting E1 or E2 buses of equivalent lengths (e.g., 8 or 16) being connected with the respective bus turns depicted in FIGS. 3–4.

Figure 6:
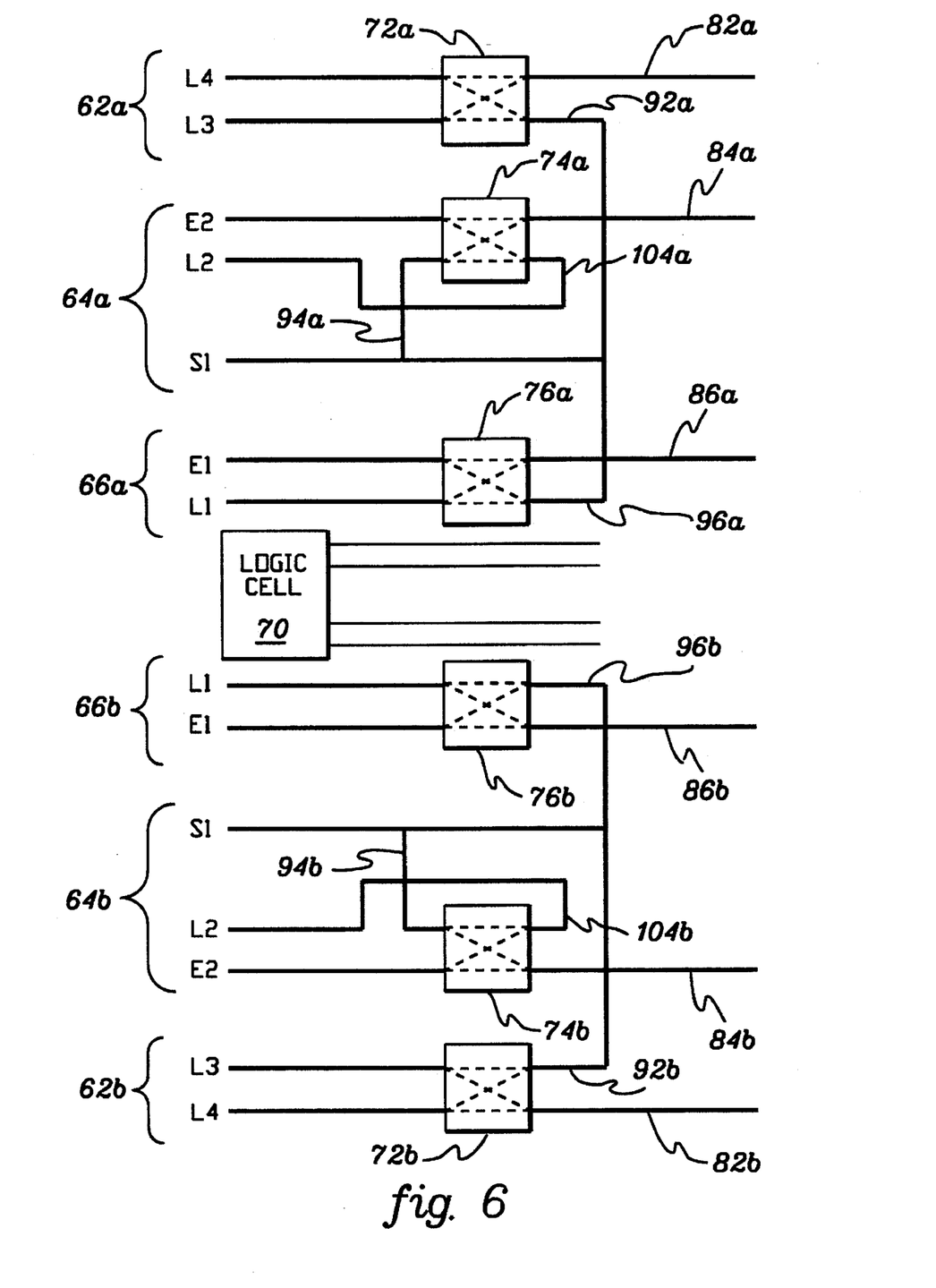
FIG. 6 depicts the conditions enforced about the perimeter of the array at the ends of the buses of each row or column of logic cells.

The switches depicted in FIG. 5 represent the switches at the interior of the array. The switch pattern is preferably modified slightly at the perimeter of the array, or at the ends of the interconnect buses. This modified switching pattern is depicted in FIG. 6. Depicted therein are the same bus groups 62, 64 and 66. With reference specifically to groups 62a, 64a and 66a, switches 72a, 74a and 76a are provided for providing signals between the respective conductors therein.

Conductors 82a, 84a and 86a continue to I/O blocks (not shown) positioned about the perimeter of the array. Output 92a is commonly connected to output 96a and the super bus S1. This pattern allows signals to be fed back from the S1 bus to either of the buses attached to switches 72a or 76a. Conversely, signals emanating from switches 72a and 76a can be fed back into super bus S1. The L2 bus 104a is wrapped around switch 74a and conductor 94a is provided between S1 and the remaining node of the switch 74a. Unlike the staggered pattern of switching interior to the row/column of logic cells, this switching pattern is enforced about the entire perimeter of the array. Groups 62b, 64b and 66b, and the perimeter switches connected thereto, are arranged symmetrically to the switches of groups 62a, 64a and 66a.

It will be evident to one of ordinary skill in the art that there are numerous ways of providing the connections required in the multiplexers, switches, bus turns and jumpers discussed above. For example, each jumper or bus turn could comprise a pass transistor, an EPROM, a fusible link or an antifuse which affects the desired isolation or connection between the conductors at the intersections. A user, upon requiring a connection at any particular intersection, would then only be required to perform the proper programming to effect the connection. A laser-programmed device could also employ optional welds at the intersection. The required connections are provided by either including or excluding the weld. A mask-programmed device would simply include or omit the relevant connections. Any structure for signal selection in which before programming, a plurality of signals are available for selection, and after programming, one of the signals is selected, is referred to herein as a multiplexer. A "connection," as used herein, and unless otherwise expressly indicated, broadly denotes either a direct, conductive connection between conductors, or an indirect (e.g., buffered/inverted) interface in which the information from one conductor is nevertheless supplied to the other conductor. Similarly, an "input" or an "output" denotes either a direct or indirect (e.g., buffered/inverted) interface, unless otherwise expressly indicated.

In a presently preferred embodiment, pass gates are employed for the jumpers and bus turns which are controlled by static random access memory ("SRAM") cells. The SRAM cells are directly or indirectly (through decoders) tied to the gates of the pass gates, thus controlling the state of the pass gates.

Figure 7:
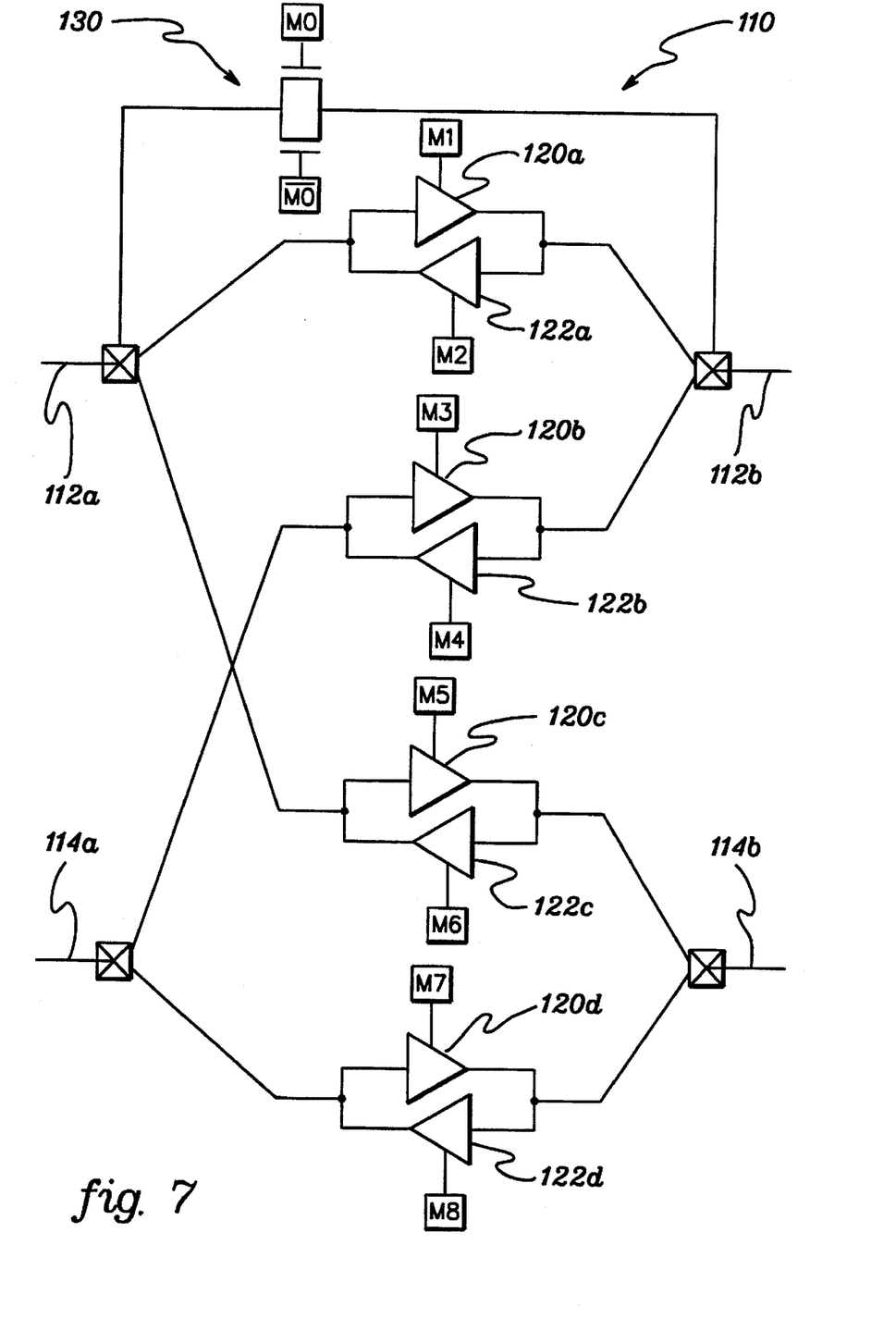
FIG. 7 depicts a switching repeater employed in the interconnect network of FIGS. 3, 5 and 6.

The switches of FIGS. 5 and 6 may be implemented using the switching repeater 110 of FIG. 7. The switching repeater 110 provides signals between conductors 112a, 112b, 114a and 114b. Signals are provided from conductors 112a and 114a via controllable tri-state buffers 120a–d. Signals are provided from conductors 112b and 114b via controllable tri-state buffers 122a–d. Each of the tri-state buffers is controlled by memory cells M1–M8 which, according to a preferred embodiment, are programmed by a user. If conductors 112a and 112b are local buses, a pass gate 130 can also be provided in the switch 110 to provide a direct conductive connection between conductors 112a and 112b. By employing this pass gate, which is controlled by another memory cell M0, and its complement, co-linear conductors of the local bus can be conductively connected together to provide a tri-state or broadcast bus, which is commonly connected to tri-state outputs of logic cells within the row or column of logic cells. Any number of other approaches can be employed to programmably provide signals between the conductors 112 and 114.

As discussed above, various technologies are known to those skilled in the art to provide array programmability.

Any of these techniques, or variants thereof, can be used to program the array of the present invention. Mask programming techniques include customizing the deposition of the final layers of metallization of an otherwise generally designed integrated circuit (see, for example, U.S. Pat. No. 3,993,919 to Cox et al. entitled "PROGRAMMABLE LATCH AND OTHER CIRCUITS FOR LOGIC ARRAYS," Nov. 23, 1976; and U.S. Pat. No. 4,742,383 to Fitzgerald entitled "MULTI-FUNCTION FET MASTER-SLICE CELL," May 3, 1988; both patents assigned to the same assignee as the present application). Laser programming techniques involve customizing the metallization layers following their deposition (see, for example, Raffel et al., "A WAFER-SCALE DIGITAL INTEGRATOR USING RESTRUCTURABLE VSLI," IEEE Journal of Solid-State Circuits, Vol. SC-20, No. 1, Feb. 1985, at pg. 399). Fusible links or antifuses can be employed and offer permanent (non-volatile) programming (see, for example, Millman, "MICROELECTRONICS," McGraw-Hill, Inc., 1979, at pg. 196; and U.S. Pat. No. 4,758,745 to El Gamal et al. entitled "USER PROGRAMMABLE INTEGRATED CIRCUIT INTERCONNECT ARCHITECTURE AND TEST METHOD," Jul. 19, 1988). Erasable programmable read only memory ("EPROM") and electrically erasable programmable read only memory ("EEPROM") devices can be used and offer semi-permanent programming. EPROMS and EEPROMS are both electrically programmable and hold their states, even if power is removed. Special erase procedures can be used, however, to reconfigure the devices (see, for example, Wood et al., "AN ELECTRICALLY ALTERABLE PLA FOR FAST TURNAROUND TIME VLSI DEVELOPMENT HARDWARE," IEEE Journal of Solid-State Circuits, Vol. SC-16, No. 5, October 1981, at pg. 570). Finally, volatile random access memory ("RAM") devices are also available which are fully programmable and reprogrammable, but which lose their programmed state if power is removed (see, for example, U.S. Pat. No. 4,177,452 to Balasubramanian et al., Dec. 4, 1979, assigned to the same assignee as the present application). These and other techniques for programming arrays are known to those in the art and are also generally described in the publication entitled "FIELD-PROGRAMMABLE GATE ARRAYS" by S. Brown, R. Francis, J. Rose and Z. Vranesic, Kluwer Academic Publishers, 1992. Each of the above-named sources is hereby incorporated herein by reference in its entirety.

Programming the jumpers, switching repeaters and bus turns of a preferred embodiment of the present invention involves SRAM cells, programmed by a user. FIG. 7 depicts exemplary connections of SRAM cells in a switching repeater. The array SRAM cells can be configured in accordance with the techniques disclosed in the publication entitled "APPLICATION NOTE AT6000 SERIES CONFIGURATION," May 1993, Revision 1B, Atmel Corporation, which is hereby incorporated herein by reference in its entirety.

The present invention provides an increased but manageable number of buses per logic cell row or column. Fourteen buses are provided, divided into two groups of seven buses each. A hierarchy is enforced within each group of seven buses by providing programmable switches and programmable elements between conductors of the buses such that the local buses are utilized for intra-sector bussing and the express buses are utilized for inter-sector busing. A staggered switching pattern is also provided in which an express bus from each of the two groups of buses is available which spans into either of the sectors adjacent a given sector. The super bus spans the entire array, and is connectable to the express and local buses at selected switches. Unlike the express and local buses which are broken at the repeaters, the super bus switches into the sectors without a break in the conductor thereof. The super bus thus allows for fast transfer of critically timed signals. The present invention strikes a balance between providing the maximum level of design flexibility, while maintaining a reasonable amount of programmable resources. The selective bus isolation from logic cells, the hierarchy enforced, and the staggered switching scheme of the present invention have all been provided to retain efficiency while providing a high level of design flexibility.

While the invention has been described in detail herein in accordance with certain preferred embodiments thereof, many modifications and changes therein may be affected by those skilled in the art. Accordingly, it is intended by the following claims to cover all such modifications and changes as fall within the true spirit and scope of the invention.

What is claimed is:

1. A programmable array having a plurality of logic cells arranged therein, the programmable array further having a programmable interconnect network including two first pluralities, of interconnect buses, each of the two first pluralities of interconnect buses being associated with, and running along, a respective row/column of logic cells of two adjacent rows/columns of logic cells of the plurality of logic cells, each of the two first pluralities of interconnect buses comprising:

first and second pluralities of local buses, said first and second pluralities of local buses each comprising conductors, wherein the conductors in each of said first and second pluralities of local buses are selectively connectable to the logic cells of the respective row/column of logic cells for logic signal input to the cells and logic signal output from the cells;

first and second pluralities of express buses, said first and second pluralities of express buses each comprising conductors, wherein the conductors in each of said first and second pluralities of express buses are generally electrically isolated from the logic cells of the respective row/column of logic cells and have lengths of less than the entire length of the respective row/column of logic cells;

first and second long interconnect buses, said first and second long interconnect buses being generally electrically isolated from the logic cells of the respective row/column of logic cells and each comprising a conductor having a length being longer than the conductors of the local and express buses;

a first plurality of programmable elements for providing signals between selected pairs of the conductors of the first plurality of local buses, the first plurality of express buses, and the first long bus; and a second plurality of programmable elements for providing signals between selected pairs of the conductors of the second plurality of local buses, the second plurality of express buses, and the second long bus.

2. A programmable array having a plurality of logic cells arranged therein, the programmable array further having a programmable interconnect network including a first plurality of interconnect buses, the first plurality of interconnect buses being associated with, and running along, a row/column of logic cells of the plurality of logic cells, the first plurality of interconnect buses comprising:

first and second pluralities of local buses, said first and second pluralities of local buses each comprising conductors, wherein the conductors in each of said first and second pluralities of local buses are selectively connectable to the logic cells of the row/column of logic cells for logic signal input to the cells and logic signal output from the cells;

first and second pluralities of express buses, said first and second pluralities of express buses each comprising conductors, wherein the conductors in each of said first and second pluralities of express buses are generally electrically isolated from the logic cells of the row/column of logic cells and have lengths of less than the entire length of the row/column of logic cells;

first and second long interconnect buses, said first and second long interconnect buses o being generally electrically isolated from the logic cells of the row/column of logic cells and each comprising a conductor having a length being longer than the conductors of the local and express buses;

a first plurality of programmable elements for providing signals between selected pairs of the conductors of the first plurality of local buses, the first plurality of express buses, and the first long bus; and a second plurality of programmable elements for providing signals between selected pairs of the conductors of the second plurality of local buses, the second plurality of express buses, and the second long bus, wherein the first and second pluralities of programmable elements divide at least some of their respective buses into conductor lengths, the first and second pluralities of programmable elements each comprising:

a plurality of programmable switches positioned at equivalent first intervals in the first plurality of interconnect buses; and a plurality of programmable jumpers connected within buses of the first and second pluralities of local buses for selectively connecting adjacent conductors thereof, wherein interior conductors of the first and second pluralities of local buses generally have lengths between programmable elements equal to the first interval and less than the first interval, and wherein interior conductors of the first and second pluralities of express buses generally have lengths between programmable elements equal to the first interval and greater than the first interval.

3. The programmable array of claim 2 further including a second plurality of interconnect buses, the second plurality of interconnect buses being associated with a column/row of logic cells of the plurality of logic cells and intersecting the first plurality of interconnect buses, the second plurality of interconnect buses comprising:

first and second pluralities of local buses, said first and second pluralities of local buses each comprising conductors, wherein the conductors in each of said first and second pluralities of local buses are selectively connectable to the logic cells of the column/row of logic cells for logic signal input to the cells and logic signal output from the cells;

first and second pluralities of express buses, said first and second pluralities of express buses each comprising conductors, wherein the conductors in each of said first and second pluralities of express buses are generally electrically isolated from the logic cells of the column/row of logic cells and have lengths of less than the entire length of the column/row of logic cells;

first and second long interconnect buses, said first and second long interconnect buses being generally electrically isolated from the logic cells of the column/row of logic cells and each comprising a conductor having a length being longer than the conductors of the local and express buses;

a first plurality of programmable elements for providing signals between selected pairs of the conductors of the first plurality of local buses, the first plurality of express buses, and the first long bus of the second plurality of interconnect buses; and a second plurality of programmable elements for providing signals between selected pairs of the conductors of the second plurality of local buses, the second plurality of express buses, and the second long bus of the second plurality of interconnect buses;

wherein the programmable interconnect network includes a plurality of programmable bus turns for programmably connecting corresponding intersecting buses of one of the first and second pluralities of local buses and the first and second pluralities of express buses of the first and second pluralities of interconnect buses.

4. The programmable array of claim 3 wherein the plurality of programmable bus turns can programmably connect the corresponding intersecting buses of all of the first and second pluralities of local buses and the first and second pluralities of express buses of the first and second pluralities of interconnect buses.

5. The programmable array of claim 3 wherein the first and second pluralities of local buses of each of the first and second pluralities of interconnect buses each includes four local buses.

6. The programmable array of claim 3 wherein the first and second pluralities of express buses of each of the first and second pluralities of interconnect buses each includes two express buses.

7. The programmable array of claim 3 wherein the first and second pluralities of interconnect buses intersect proximate a given logic cell common to said row/column and said column/row of logic cells of the plurality of logic cells, and wherein substantially all of the buses of the first and second pluralities of local buses of the first and second pluralities of interconnect buses are programmably connectable to the given logic cell for providing input signals thereto, and wherein the substantially all of the buses of the first and second pluralities of local buses of the first and second pluralities of interconnect buses are programmably connectable to the given logic cell for receiving output signals therefrom.

8. The programmable array of claim 7 wherein the given logic cell includes at least two input nodes, and wherein substantially all of the buses of the first and second pluralities of local buses of the first and second pluralities of interconnect buses are programmably connectable to each input node of the at least two input nodes for providing input signals thereto.

9. A programmable array having a plurality of logic cells arranged therein, the programmable array further having a programmable interconnect network including a first plurality of interconnect buses being associated with, and running along, a row/column of logic cells of the plurality of logic cells, the first plurality of interconnect buses comprising:

first and second pluralities of local buses, said first and second pluralities of local buses each comprising conductors, wherein the conductors in each of said first and second pluralities of local buses are selectively connectable to the logic cells of the row/column of logic cells for logic signal input to the cells and logic signal output from the cells;

first and second pluralities of express buses, said first and second pluralities of express buses each comprising conductors, wherein the conductors in each of said first and second pluralities of express buses are generally electrically isolated from the logic cells of the row/column of logic cells and have lengths of less than the entire length of the row/column of logic cells;

first and second long interconnect buses, said first and second long interconnect buses being generally electrically isolated from the logic cells of the row/column of logic cells and each comprising a conductor having a length being longer than the conductors of the local and express buses;

a first plurality of programmable elements for providing signals between selected pairs of the conductors of the first plurality of local buses, the first plurality of express buses, and the first long bus; and a second plurality of programmable elements for providing signals between selected pairs of the conductors of the second plurality of local buses, the second plurality of express buses and the second long bus, wherein the row/column of logic cells is arranged into sectors of logic cells, the sectors being defined by a first length being measurable in logic cell units, and wherein interior conductors of the first and second pluralities of local buses have lengths of lees than and equal to the first length and the conductors of the first and second pluralities of express buses have lengths of greater than and equal to the first length.

10. A programmable interconnect system for a programmable array having a plurality of logic cells arranged therein, the programmable interconnect system having a first plurality of interconnect buses (34a) associated with, and running along, a row/column of logic cells of the plurality of logic cells, the row/column of logic cells being divisible into at least two pluralities of contiguous logic cells, each plurality of the at least two pluralities of contiguous logic cells having a first selected number of logic cells therein, the first selected number of logic cells being greater than one, wherein the first plurality of interconnect buses comprises:

a plurality of local buses, said plurality of local buses being connectable to logic cells of the row/column of logic cells, said plurality of local buses including a first plurality of conductors and a second plurality of conductors, the conductors of the first and second pluralities of conductors being interior conductors, wherein the conductors of the first plurality of conductors of the plurality of local buses have a length less than the first selected number of logic cells, and the conductors of the second plurality of conductors of the plurality of local buses have a length equal to the first selected number of logic cells; and a plurality of express buses, said plurality of express buses being generally electrically isolated from the logic cells of the row/column of logic cells, said plurality of express buses including a first plurality of conductors and a second plurality of conductors, the conductors of the first and second pluralities of conductors of the plurality of express buses being interior conductors, wherein the conductors of the first plurality of conductors of the plurality of express buses have a length equal to the first selected number of logic cells, and the conductors of the second plurality of conductors of the plurality of express buses have a length greater than the first selected number of logic cells and less than the length of the entire row/column of logic cells.

11. The programmable interconnect system of claim 10 wherein the conductors of the second plurality of conductors of the plurality of express buses have a length equal to an integer multiple of the first selected number of logic cells.

12. The programmable interconnect system of claim 11 wherein the conductors of the second plurality of conductors of the plurality of express buses have a length equal to: $(2) \times$(the first selected number of logic cells).

13. The programmable interconnect system of claim 10 wherein the conductors of the first plurality of conductors of the plurality of local buses have a length equal to: $(0.5) \times$(the first selected number of logic cells).

14. The programmable interconnect system of claim 10 wherein the first plurality of interconnect buses includes a long bus having a conductor of a length longer than the conductors of the local and express buses.

15. The programmable interconnect system of claim 10 wherein the plurality of local buses includes first, second, third and fourth buses, the first and third buses comprising the first plurality of conductors, the second and fourth buses comprising the second plurality of conductors.

16. The programmable interconnect system of claim 15 wherein the plurality of express buses includes a first bus comprising the first plurality of conductors and a second bus comprising the second plurality of conductors.

17. The programmable interconnect system of claim 16 further comprising a first plurality of programmable switches connected within the first plurality of interconnect buses for providing signals between conductors of the third and fourth buses of the plurality of local buses, each switch of the first plurality of programmable switches being separated by a first interval corresponding to the first selected number of logic cells.

18. The programmable interconnect system of claim 17 further comprising a second plurality of programmable switches connected within the first plurality of interconnect buses and corresponding in position to the first plurality of programmable switches, each switch of the second plurality of programmable switches for providing signals between conductors of the first bus of the plurality of local buses and the first bus of the plurality of express buses.

19. The programmable interconnect system of claim 18 further comprising a plurality of programmable jumpers, at least one jumper of the plurality of programmable jumpers being positioned within at least one first interval and for providing signals between adjacent conductors of the third bus of the plurality of local buses or between adjacent conductors of the first bus of the plurality of local buses.

20. The programmable interconnect system of claim 18 further comprising:

a first plurality of programmable jumpers, each jumper of the first plurality of programmable jumpers being positioned within the first intervals and for providing signals between adjacent conductors of the first bus of the plurality of local buses;

a second plurality of programmable jumpers, each jumper of the second plurality of programmable jumpers being positioned within the first intervals and for providing signals between adjacent conductors of the third bus of the plurality of local buses.

21. The programmable interconnect system of claim 20 wherein the first plurality of interconnect buses includes a long bus having a conductor running substantially the entire length of the row/column of logic cells, the programmable interconnect system further comprising a third plurality of programmable switches connected within the first plurality of interconnect buses, the switches of the third plurality of programmable switches being separated by respective second intervals corresponding to twice the first selected number of logic cells and for providing signals between conductors of the second bus of the plurality of local buses and the conductor of the long bus.

22. The programmable interconnect system of claim 21 wherein the conductors of the second plurality of conductors of the second bus of the plurality of express buses have a length equal to twice the first selected number of logic cells, the programmable interconnect system further comprising a fourth plurality of programmable switches connected within the first plurality of interconnect buses, each switch of the fourth plurality of switches being separated by the second intervals and being offset from the third plurality of switches by about half the first selected number of logic cells, the fourth plurality of switches for providing signals between conductors of the second bus of the plurality of local buses and the second bus of the plurality of express buses.

23. The programmable interconnect system of claim 22 wherein at least one of the programmable switches of one of the first, second, third and fourth pluralities of programmable switches comprises a programmable switching repeater such that signals switched therethrough can be buffered therein.

24. The programmable interconnect system of claim 23 wherein the programmable switching repeater includes a programmable transmission gate connected between adjacent conductors of one bus of the plurality of local buses such that said adjacent conductors can be programmably conductively connected by said transmission gate.

25. The programmable interconnect system of claim 22 further comprising a second plurality of interconnect buses (34b) being associated with, and running along, the row/column of logic cells, the second plurality of interconnect buses including a plurality of local buses, a plurality of express buses and a long bus, the buses of the second plurality of interconnect buses being formed generally like the corresponding buses of the first plurality of interconnect buses.

26. A programmable array having a plurality of logic cells arranged therein, said programmable array further having a programmable interconnect network including a plurality of interconnect buses, the plurality of interconnect buses being associated with, and running along, a row/column of logic cells of the plurality of logic cells, the plurality of interconnect buses comprising:

a first group of buses (64a) including a first, second and third bus of a first, second and third type, respectively;

a first plurality of programmable interior switches, separated by generally equivalent first intervals, for providing signals between conductors of the first and third buses, but not the second bus, of the first group of buses;

a second plurality of programmable interior switches, separated by the generally equivalent first intervals, and offset from the first plurality of switches by at least the length of one logic cell, for providing signals between conductors of the first and second buses, but not the third bus, of the first group of buses;

a second group of buses (64b) including a first, second and third bus of the first, second and third types, respectively; and a third plurality of programmable interior switches, corresponding in position to the first plurality of programmable switches, for providing signals between conductors of the first and second buses, but not the third bus, of the second group of buses; and a fourth plurality of programmable interior switches, corresponding in position to the second plurality of switches, for providing signals between conductors of the first and third buses, but not the second bus, of the second group of buses such that a staggered switching pattern results in which the second buses are not interrupted by either the first or fourth pluralities of switches and the third buses are not interrupted by either the second or third pluralities of switches.

27. The programmable array of claim 26 wherein the first type of bus is a local bus programmably connectable to logic cells of the row/column of logic cells, the second type of bus is an express bus isolated from the logic cells of the row/column of logic cells, and the third type of bus is a super bus comprising a conductor being isolated from the logic cells of the row/column of logic cells and running substantially the entire length of the row/column of logic cells.

28. A programmable array having a plurality of logic cells arranged therein, said programmable array further having a programmable interconnect network including a plurality of interconnect buses, the plurality of interconnect buses being associated with, and running along, a row/column of logic cells of the plurality of logic cells, the plurality of interconnect buses comprising:

first (64a) and second (64b) groups of buses, each of the first and second groups of buses including a first, second and third bus; and a plurality of programmable interior switches connected at regular intervals within each of the first and second groups of buses, each of the plurality of programmable interior switches for providing signals between conductors of two buses within each of the first and second groups of buses, wherein the second buses are isolated from odd/even ones of the plurality of programmable interior switches within the first group of buses and from even/odd ones of the plurality of programmable interior switches within the second group of buses, and wherein the third buses are isolated from the even/odd ones of the plurality of programmable interior switches within the first group of buses and from odd/even ones of the plurality of programmable interior switches within the second group of buses.

29. The programmable array of claim 28 wherein the first buses are local buses programmably connectable to logic cells of the row/column of logic cells, the second buses are express buses isolated from the logic cells of the row/column of logic cells, and the third buses are super buses having a conductor being isolated from the logic cells of the row/column of logic cells and running substantially the entire length of the row/column of logic cells.

* * * * *

UNITED STATES PATENT AND TRADEMARK OFFICE
CERTIFICATE OF CORRECTION

PATENT NO. : 5,631,578
DATED : May 20, 1997
INVENTOR(S) : Clinton et al.

It is certified that error appears in the above-identified patent and that said Letters Patent is hereby corrected as shown below:

Column 1, line 57    "programing" should read --programming--.

Column 4, lines 9-13    "the amount of unused resources following array and interconnect system of the present invention simultaneously afford an array user or programmer a suitable level of design flexibility while minimizing programming."
should read
--and interconnect system of the present invention simultaneously afford an array user or programmer a suitable level of design flexibility while minimizing the amount of unused resources following array programming.--.

Column 10, line 25    "pluralities, of" should read --pluralities of--.

Column 11, line 16    "buses o being" should read --buses being--.

Column 12, line 58    "buses being" should read --buses, the first plurality of interconnect buses being--.

Column 13, line 26    "lees" should read --less--.

Signed and Sealed this

Seventh Day of April, 1998

Attest:

BRUCE LEHMAN

Attesting Officer    Commissioner of Patents and Trademarks